United States Patent
Kobayashi et al.

(10) Patent No.: US 11,781,064 B2
(45) Date of Patent: Oct. 10, 2023

(54) PHOSPHOR POWDER AND LIGHT-EMITTING DEVICE

(71) Applicant: DENKA COMPANY LIMITED, Tokyo (JP)

(72) Inventors: Manabu Kobayashi, Tokyo (JP); Tomohiro Nomiyama, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 232 days.

(21) Appl. No.: 17/605,079

(22) PCT Filed: Apr. 15, 2020

(86) PCT No.: PCT/JP2020/016538
§ 371 (c)(1),
(2) Date: Oct. 20, 2021

(87) PCT Pub. No.: WO2020/218109
PCT Pub. Date: Oct. 29, 2020

(65) Prior Publication Data
US 2022/0204842 A1    Jun. 30, 2022

(30) Foreign Application Priority Data

Apr. 23, 2019   (JP)  ................. 2019-081456

(51) Int. Cl.
| | | |
|---|---|---|
| *C09K 11/77* | (2006.01) | |
| *C01F 17/30* | (2020.01) | |
| *C09K 11/61* | (2006.01) | |
| *H01L 33/50* | (2010.01) | |
| *H01L 33/26* | (2010.01) | |

(52) U.S. Cl.
CPC .......... *C09K 11/7734* (2013.01); *C01F 17/30* (2020.01); *C09K 11/616* (2013.01); *H01L 33/26* (2013.01); *H01L 33/502* (2013.01); *C01P 2006/60* (2013.01)

(58) Field of Classification Search
CPC ... C09K 11/7734; C09K 11/616; C01F 17/30; H01L 33/502
See application file for complete search history.

(56) References Cited

U.S. PATENT DOCUMENTS

| | | |
|---|---|---|
| 8,080,174 B2 | 12/2011 | Kawasaki et al. |
| 8,487,393 B2 | 7/2013 | Emoto et al. |
| 8,709,283 B2 | 4/2014 | Masuda et al. |
| 9,382,477 B2 | 7/2016 | Ueda et al. |
| 9,496,463 B2 | 11/2016 | Masuda et al. |
| 9,758,720 B2 | 9/2017 | Fujinaga et al. |
| 10,818,824 B2 | 10/2020 | Hirosaki |
| 2010/0219741 A1 | 9/2010 | Kawasaki et al. |
| 2011/0198656 A1 | 8/2011 | Emoto et al. |
| 2012/0194762 A1 | 8/2012 | Masuda et al. |
| 2012/0228551 A1 | 9/2012 | Emoto et al. |
| 2014/0218658 A1 | 8/2014 | Masuda et al. |
| 2014/0264170 A1 | 9/2014 | Fujinaga et al. |
| 2015/0044471 A1 | 2/2015 | Ueda et al. |
| 2018/0127647 A1 | 5/2018 | Hirosaki |

FOREIGN PATENT DOCUMENTS

| | | |
|---|---|---|
| CN | 101466813 A | 6/2009 |
| CN | 103842473 A | 6/2014 |
| CN | 104145003 A | 11/2014 |
| JP | 2007-308593 A | 11/2007 |
| JP | 2017-210529 A | 11/2017 |
| TW | 201125955 A | 8/2011 |
| WO | 2010/143590 A1 | 12/2010 |
| WO | 2011/083671 A1 | 7/2011 |
| WO | 2016/186058 A1 | 11/2016 |

OTHER PUBLICATIONS

Feb. 15, 2023 Office Action and Search Report issued in Chinese Patent Application No. 202080030346.X.
Jul. 14, 2020 International Search Report issued in International Patent Application No. PCT/JP2020/016538.
Jun. 20, 2023 Office Action issued in Taiwanese Patent Application No. 109113119.

*Primary Examiner* — Karabi Guharay
(74) *Attorney, Agent, or Firm* — Oliff PLC

(57) ABSTRACT

A phosphor powder contains an EU-activated β-type sialon phosphor particles. When a median diameter in the phosphor powder having not been subjected to an ultrasonic homogenizer treatment is set as D1 and a median diameter in the phosphor powder having been subjected to an ultrasonic homogenizer treatment is set as D2, $1.05 \leq D1/D2 \leq 1.70$. A dispersion liquid in which 30 mg of the phosphor powder is uniformly dispersed in 100 ml of a 0.2% concentration of a sodium hexametaphosphate aqueous solution is added to a columnar container of which a bottom surface has an inner diameter of 5.5 cm. Then, the dispersion liquid is irradiated with ultrasonic waves for 3 minutes at a frequency of 19.5 kHz, and an output of 150 W, in a state where a cylindrical tip, which has an outer diameter of 20 mm, of an ultrasonic homogenizer is immersed in the dispersion liquid in $\geq 1.0$ cm.

4 Claims, No Drawings

PHOSPHOR POWDER AND LIGHT-EMITTING DEVICE

TECHNICAL FIELD

The present invention relates to a phosphor powder and a light-emitting device.

BACKGROUND ART

In recent years, development of a light-emitting device combining a semiconductor light-emitting element such as an LED and a phosphor that absorbs a part of light from the semiconductor light-emitting element and converts the absorbed light into wavelength conversion light of long wavelength to emit light is in progress. As the phosphor, a nitride phosphor or an oxynitride phosphor having a relatively stable crystal structure is attracting attention. In particular, since EU-activated β-type sialon phosphors have characteristics of excellent heat resistance and durability, and a small change in brightness with increasing temperature and also are excited by a wide range of wavelengths of ultraviolet to blue light and emits green light having a peak in the wavelength range of 520 to 550 nm, a practical use is progressing as a phosphor useful for white LEDs (see Patent Document 1).

For example, Patent Document 2 discloses a β-type sialon phosphor satisfying conditions of an average particle size (d1) (air permeation method) of 9 to 16 μm, a median diameter (50% D) in a particle size distribution of 12.5 to 35 μm, and 50% D/d1=1.4 to 2.2.

RELATED DOCUMENTS

Patent Documents

[Patent Document 1] International Publication No. 2010/143590
[Patent Document 2] International Publication No. 2011/083671

SUMMARY OF THE INVENTION

Technical Problem

In recent years, with an increase in demand for white LEDs, a higher brightness has been further required, and a required level for characteristics of a β-type sialon phosphor used for white LEDs has become higher and higher.

The present invention has been made in view of the problems mentioned above, and an object of the present invention is to provide a technique relating to a β-type sialon phosphor capable of improving the brightness of a white LED.

Solution to Problem

According to the present invention, there is provided a phosphor powder including, as a main component: EU-activated β-type sialon phosphor particles, in which when a median diameter ($D_{50}$) measured by a wet measurement using a laser diffraction type particle size distribution measuring device, in the phosphor powder which has not been subjected to an ultrasonic homogenizer treatment, is set as D1 and a median diameter ($D_{50}$) measured by the wet measurement using a laser diffraction type particle size distribution measuring device, in the phosphor powder which has been subjected to an ultrasonic homogenizer treatment under the following condition, is set as D2, D1/D2 is equal to or more than 1.05 and equal to or less than 1.70.

(Conditions)

A dispersion liquid in which 30 mg of the phosphor powder is uniformly dispersed in 100 ml of a 0.2% sodium hexametaphosphate aqueous solution is added to a columnar container of which a bottom surface has an inner diameter of 5.5 cm. Then, the dispersion liquid is irradiated with ultrasonic waves for 3 minutes at a frequency of 19.5 kHz, and an output of 150 W, in a state where a cylindrical tip, having an outer diameter of 20 mm, of an ultrasonic homogenizer is immersed in the dispersion liquid in equal to or more than 1.0 cm.

In addition, according to the present invention, there is provided a light-emitting device including a light-emitting element and the phosphor powder described above.

Advantageous Effects of Invention

The phosphor powder of the present invention allows brightness of a white LED to be improved.

DESCRIPTION OF EMBODIMENTS

Hereinafter, embodiments of the present invention will be described in detail.

The present inventors studied a relationship between an aggregation state of Eu-activated β-type sialon phosphor particles and brightness of a white LED using the phosphor particles, and found that a ratio between median diameters of the phosphor particles before and after an ultrasonic homogenizer has a close relationship with the brightness of the white LED using the phosphor. In EU-activated β-type sialon phosphor particles in the related art, study has not been made on adjusting a ratio of the median diameters before and after the ultrasonic homogenizer treatment, and the present inventors considered that there is room for improving the brightness of the white LED by controlling the degree of aggregation of the phosphor particles, leading to the completion of the present invention.

The phosphor powder according to the embodiment contains Eu-activated β-type sialon phosphor particles (hereinafter, may be simply referred to as "phosphor particles") as a main component. Here, the main component refers to a case where equal to or more than 90% by mass of Eu-activated β-type sialon phosphor particles are contained in the entire phosphor powder. In this case, the phosphor powder may further contain phosphor particles other than the Eu-activated β-type sialon phosphor particles.

The phosphor powder of the present embodiment preferably consists of EU-activated β-type sialon phosphor particles. In other words, a content rate of the Eu-activated β-type sialon phosphor particles is preferably 100% by mass.

A component of the Eu-activated β-type sialon phosphor particles of the present embodiment is a phosphor in which divalent europium ($Eu^{2+}$) is solid-dissolved as a light emitting center in β-type sialon represented by a general formula: $Si_{6-z}Al_zO_zN_{8-z}$ (z=0.005 to 1).

The phosphor powder according to the embodiment includes, as a main component: an Eu-activated β-type sialon phosphor particles, in which when a median diameter ($D_{50}$) measured by a wet measurement using a laser diffraction type particle size distribution measuring device, in the phosphor powder which has not been subjected to an ultrasonic homogenizer treatment, is set as D1 and a median diameter ($D_{50}$) measured by the wet measurement using a laser diffraction type particle size distribution measuring device, in the phosphor powder which has been subjected to an ultrasonic homogenizer treatment under the following condition, is set as D2, D1/D2 is equal to or more than 1.05 and equal to or less than 1.70.

(Conditions)

A dispersion liquid in which 30 mg of the phosphor powder is uniformly dispersed in 100 ml of a 0.2% concentration of a sodium hexametaphosphate aqueous solution is added to a columnar container of which a bottom surface has an inner diameter of 5.5 cm. Then, the dispersion liquid is irradiated with ultrasonic waves for 3 minutes at a frequency of 19.5 kHz, and an output of 150 W, in a state where a cylindrical tip, having an outer diameter of 20 mm, of an ultrasonic homogenizer is immersed in the dispersion liquid in equal to or more than 1.0 cm.

The phosphor powder of the present embodiment is monodispersed by loosening an aggregation of the phosphor particles by performing an ultrasonic homogenizer treatment under the above specific conditions. In other words, the phosphor powder of the present embodiment is an appropriately aggregated phosphor particle. When there is almost no aggregation, it is close to a monodisperse state. Therefore, even when the phosphor powder is dispersed by the ultrasonic homogenizer treatment under the above specific conditions, D1 and D2 are almost the same, and the D1/D2 becomes close to 1. Further, in a case where the degree of aggregation of the phosphor particles is too large, the aggregation is loosened by the ultrasonic homogenizer treatment under the above specific conditions and the number of phosphor particles that are monodispersed increases, and thus the D1/D2 becomes large.

When setting the D1/D2 to be equal to or more than 1.05 in the phosphor powder of the present embodiment, it is possible to improve the brightness of the white LED using the phosphor powder. On the other hand, when setting the D1/D2 to be equal to or less than 1.70, the aggregation of particles is suppressed. Accordingly, dispersibility of the white LED described later in a sealing material is improved and the decrease in brightness can be suppressed.

As described in Patent Documents 1 and 2, the phosphor powder including β-type sialon phosphor particles at a normal technical level does not substantially change in an aggregation state of the phosphor powder even when subjected to the ultrasonic homogenizer treatment. That is, it can be said that there is almost no aggregation. On the other hand, in the phosphor powder of the present embodiment, the D1/D2 is specified to a predetermined range and the phosphor powder is aggregated appropriately, whereby it is possible to improve a total luminous flux when the phosphor powder of the present embodiment is used for a white LED.

The dispersion liquid under the above conditions is obtained by collecting 30 mg of the phosphor powder and 100 ml of a sodium hexametaphosphate aqueous solution adjusted to 0.2% in a 200 ml beaker, and then stirring uniformly at room temperature (25° C.) using a spatula to the extent that precipitation does not occur.

The median diameter ($D_{50}$) of the phosphor powder is specifically calculated by a wet measurement using a laser diffraction type particle size distribution measuring device or a flow cell method. In this case, when the powder is supplied to the measuring device, ultrasonic waves are not applied, and a sample is supplied and measured at a pump flow rate of 75% using an attached sample delivery controller (SDC) as a sample supplying machine. As the dispersion medium, a sodium hexametaphosphate aqueous solution adjusted to 0.2% is used.

A lower limit of the D1/D2 is preferably equal to or more than 1.10, more preferably equal to or more than 1.15, and still more preferably equal to or more than 1.20. On the other hand, the D1/D2 is preferably equal to or less than 1.65, and more preferably equal to or less than 1.55. When setting the lower limit and the upper limit of the D1/D2 to the above range, the brightness of the white LED using the phosphor powder can be further improved.

A lower limit of the D1 is preferably equal to or more than 10 μm, more preferably equal to or more than 13 μm, and still more preferably equal to or more than 16 μm. In addition, an upper limit of the D1 is preferably equal to or less than 35 μm, more preferably equal to or less than 32 μm, and still more preferably equal to or less than 29 μm. By setting the lower limit and the upper limit of the D1 to the above range, the brightness of the white LED using the phosphor powder can be even further improved.

A lower limit of the D2 is preferably equal to or more than 8 μm, more preferably equal to or more than 11 μm, and still more preferably equal to or more than 14 μm. An upper limit of the D2 is preferably equal to or less than 25 μm, more preferably equal to or less than 22 μm, and still more preferably equal to or less than 19 μm. By setting the lower limit and the upper limit of the D2 to the above range, the brightness of the white LED using the phosphor powder can be even further improved.

Also, the median diameter ($D_{10}$) of the phosphor powder according to the embodiment measured by a wet measurement using the laser diffraction type particle size distribution measuring device is preferably 7.0 to 25 μm, and more preferably 9.5 to 20 μm.

Also, the median diameter ($D_{90}$) of the phosphor powder according to the embodiment measured by the wet measurement using the laser diffraction type particle size distribution measuring device is preferably 20 to 60 μm, and more preferably 25 to 55 μm.

By setting the median diameter ($D_{10}$) and the median diameter ($D_{90}$) of the phosphor powder according to the embodiment within the above numerical ranges, unevenness of the phosphor powder is suppressed, and the brightness of the white LED using the phosphor powder can be even further improved.

(Method of Producing Phosphor Powder)

As described below, a method of producing the phosphor powder of the present embodiment is configured to include, for example, a mixing step, a first firing step, a second firing step, a cracking-crushing step, an annealing treatment step, an acid treatment step, and washing-filtering step. The above-described D1/D2 is realized by comprehensively and appropriately combining each of the steps and adjusting a filling method (filling density), a temperature lowering rate, and the like in the annealing treatment step.

<Mixing Step>

In the mixing step, for example, a silicon compound such as silicon nitride, for example, an aluminum compound such as aluminum nitride or aluminum oxide, an Eu compound selected from Eu metals, oxides, carbonates, halides, nitrides, or oxynitrides (collectively referred to as raw material compounds) are weighed and mixed so as to form the phosphor powder of the present embodiment, respectively, to prepare a raw material mixture. A method of mixing the raw material compounds is not particularly limited, and examples thereof include a method of mixing using a known mixing device such as a V-type mixer, and further mixing sufficiently using a mortar, a ball mill, a planetary mill, a jet mill, or the like. When mixing the europium nitride or the like that reacts violently with moisture and oxygen in the air, it is appropriate to handle the material in a glove box substituted with an inert atmosphere.

Examples of the aluminum compound can include one or more types of aluminum compounds selected from aluminum-containing compounds that are decomposed by heating to produce aluminum oxide.

<First Firing Step>

A reaction in the raw material powder proceeds by filling the raw material mixed powder into a container such as a crucible whose at least a surface in contact with the raw material is made of boron nitride and heating at a temperature equal to or higher than 1550° C. and equal to or lower than 2100° C. in a nitrogen atmosphere. The purpose of the first firing step is to make Eu highly dispersed in the mixed powder by using the reaction, and as long as β-type sialon is partially produced at this stage, the amount of the production rate thereof does not matter. Eu is highly dispersed by diffusing the oxide contained in the raw material in a liquid phase produced at a high temperature. By setting the firing temperature to equal to or higher than 1550° C., an abundance of the liquid phase can be made sufficient, and the diffusion of Eu can be made sufficient. By setting the firing temperature to equal to or lower than 2100° C., it is not necessary to require a very high nitrogen pressure to suppress the decomposition of β-type sialon, which is industrially preferable. The firing time in the first firing step depends on the firing temperature, and is preferably adjusted in the range of equal to or loner than 2 hours and equal to or shorter than 18 hours.

A sample (first fired powder) obtained in the first firing step may be powdery or lumpy depending on the raw material compounding composition and the firing temperature. Therefore, cracking and crushing are performed as necessary to make it into a powder form that can be passed through a sieve having a mesh size of 45 μm, for example.

<Second Firing Step>

Next, one or more types selected from silicon nitride, silicon oxide, aluminum nitride, aluminum oxide, and europium oxide are added to the first fired powder, mixed by the same method as in the mixing step, filled in a container, and subjected to a second firing step at a temperature equal to or higher than 1900° C. and equal to or lower than 2100° C. in a nitrogen atmosphere to obtain β-type sialon in which Eu is solid-dissolved. In the second firing step, a firing temperature of equal to or higher than 1900° C. is preferable in order to increase the production rate of the β-type sialon. The firing time in the second firing step depends on the firing temperature, and is preferably adjusted in the range of equal to or loner than 6 hours and equal to or shorter than 18 hours.

<Cracking-Crushing Step>

The sample (second fired powder) after the second firing step is lumpy, and thus made into a powder form having a predetermined size by combining classification operations with cracking and crushing as necessary. Specific examples of a treatment operation include a method of cracking and crushing the second fired powder and sieving the powder in a mesh size of a range of equal to or more than 20 μm and equal to or less than 45 μm to obtain a powder that has passed through the sieve, or a method of crushing the second fired powder to a predetermined particle size using a general crusher such as a ball mill, a vibration mill, or a jet mill. When using the crusher, it is preferable to adopt a crushing device or a crushing condition that is as mild as possible so as not to cause mechanical damage to the second fired powder.

Further, in order to prevent impurity elements from being mixed during the crushing treatment, a part of the crushing device that comes into contact with the second fired powder, which is the object to be crushed, is preferably made of high toughness ceramics such as silicon nitride, alumina, and sialon. The second fired powder after the cracking-crushing step is preferably adjusted to obtain a powder form having an average grain diameter of equal to or less than 50 μm, from the viewpoint of finally obtaining an oxynitride phosphor for LED, which has high absorption efficiency of excitation light and exhibits sufficient luminous efficiency.

<Annealing Treatment Step>

The Eu-activated β-type sialon powder synthesized by the above method is subjected to an annealing treatment in a non-oxidizing atmosphere other than pure nitrogen at a temperature lower than that in the second firing step to increase the proportion of $Eu^{2+}$ in Eu and change a state so that Eu that inhibits fluorescence emission can be dissolved and removed by acid treatment in the next step. A noble gas or a reducing gas is preferable as the atmosphere for performing the annealing treatment. The noble gas is, for example, a gas of a Group 18 element such as argon or helium. The reducing gas is a gas having a reducing power such as ammonia, carbon dioxide, carbon monoxide, and hydrogen. The reducing gas may be used alone or as a mixed gas with a neutral gas such as nitrogen or a noble gas.

An appropriate range of the temperature of the annealing treatment varies depending on an atmosphere to be used. When the temperature is too low, a state change of Eu does not proceed and characteristics do not improve, and when the temperature is too high, β-type sialon is decomposed, which are not preferable. An appropriate temperature range in a case where the annealing treatment is performed in a noble gas atmosphere such as argon or helium is equal to or higher than 1350° C. and equal to or less than 1600° C. The annealing time in the annealing treatment step depends on the annealing temperature, and is preferably adjusted in the range of equal to or loner than 4 hours and equal to or shorter than 12 hours.

From a viewpoint of setting the above-described D1/D2 to an appropriate value, in a case where the above-described annealing treatment is performed, a container with a lid (such as a crucible whose surface in contact with the raw material is made of boron nitride) is preferably filled with the Eu-activated β-type sialon powder while tapping to appropriately increase the degree of filling. As the degree of filling, for example, the Eu-activated β-type sialon powder is in a dense state so as to come into contact with the lid.

Further, from the viewpoint of setting the above-described D1/D2 to an appropriate value, it is preferable to cool the EU-activated β-type sialon powder after the annealing treatment at a temperature lowering rate faster than a level of the related art. As the cooling conditions, preferably, a temperature range of 1000° C. to 1500° C. is lowered at 3 to 10° C./min, and more preferably, lowered at 4 to 6° C./min.

<Acid Treatment Step>

Next, the β-type sialon powder subjected to the annealing treatment is subjected to an acid treatment. As the acid used for the acid treatment, one type or two or more types of acids selected from hydrofluoric acid, sulfuric acid, phosphoric acid, hydrochloric acid, and nitric acid are used, and used in the form of an aqueous solution containing these acids. The main purpose of the acid treatment is to remove a compound that inhibits fluorescence and light emission that occur during the annealing treatment, and it is preferable to use a mixed acid of the hydrofluoric acid and the nitric acid. The acid treatment step is performed by dispersing β-type sialon powder subjected to the annealing treatment in an aqueous solution containing the above acid and stirring for several minutes to several hours (for example, equal to or longer than 10 minutes and equal to or shorter than 3 hours) to react with the acid. The temperature of the acid may be room temperature, and is preferably equal to or higher than 50° C. and equal to or lower than 80° C., because the higher the temperature, the easier the reaction will proceed.

<Washing-Filtering Step>

After the acid treatment step, the β-type sialon powder is separated from the acid with a filter or the like, and the separated β-type sialon powder is washed with water. The β-type sialon powder after being washed with water is filtered using a filter to obtain a phosphor powder containing Eu-activated β-type sialon phosphor particles as a main component.

The phosphor powder of the present embodiment may be enclosed in a package made of an aluminum laminated film. That is, the package contains the phosphor powder of the present embodiment in a dry state inside the package.

(Light-Emitting Device)

The light-emitting device according to the embodiment includes a light-emitting element and a wavelength conversion unit using the phosphor powder of the above-described embodiment. More specifically, the light-emitting device is a white light emitting diode (LED) including the phosphor powder of the present embodiment. In such an LED, it is preferable to use the phosphor powder sealed in a sealing material. Such a sealing material is not particularly limited, and examples thereof include silicone resin, epoxy resin, perfluoropolymer resin, and glass. In applications that require high output and high brightness, such as display backlight applications, a sealing material that is durable even when exposed to high temperature or strong light is preferable, and from this viewpoint, the silicone resin is particularly preferable.

Further, as the light-emitting light source, it is preferable to use a light source that emits light having a wavelength of a color that complements green emission of the β-type sialon phosphor or light having a wavelength that can efficiently excite the β-type sialon phosphor, for example, a blue light source (such as blue LED) can be used. Preferably, a peak wavelength of the light from the light-emitting light source can set to a wavelength in a range including blue (for example, a range of equal to or more than 420 nm and equal to or less than 560 nm), and more preferably can set to a range of equal to or more than 420 nm and equal to or less than 480 nm.

Further, the light-emitting device according to the embodiment can further include a phosphor that emits red light having a peak wavelength of equal to or more than 610 nm and equal to or less than 670 nm (hereinafter, referred to as "red phosphor") when receiving excitation light having a wavelength of 455 nm. The red phosphor may be a single species, or may be two or more species. The light-emitting device of the present invention having such a configuration can obtain white light by a combination of the β-type sialon phosphor that emits green light, the light-emitting light source that produces blue light, and the red phosphor that emits red light, and it is also possible to obtain light emission in various color gamuts by changing a mixing ratio of these three colors. In particular, it is preferable to use a Mn-activated $K_2SiF_6$ phosphor having an emission spectrum with a narrow half-value width as the red phosphor because a light-emitting device having a high color gamut can be obtained.

In the light-emitting device of the present embodiment, the brightness can be improved by using the above-described phosphor powder as a wavelength conversion member.

Although the embodiments of the present invention have been described above, these are examples of the present invention, and various configurations other than the above can also be adopted.

EXAMPLES

Hereinafter, the present invention will be described with reference to Examples and Comparative Examples, but the present invention is not limited thereto.

Example 1

A method of producing the phosphor powder of Example 1 will be described.

<Mixing Step>

95.90% by mass of an α-type silicon nitride powder (manufactured by Ube Industries, Ltd., SN-E10 grade, and oxygen content of 1.0% by mass), 2.75% by mass of an aluminum nitride powder (manufactured by Tokuyama Corporation, F grade, and oxygen content of 0.8% by mass), 0.56% by mass of an aluminum oxide powder (manufactured by Taimei Chemicals Co., Ltd., and TM-DAR grade), and 0.80% by mass of an europium oxide powder (manufactured by Shin-Etsu Chemical Co., Ltd., and RU grade) were mixed using a V-type mixer (S-3, manufactured by Tsutsui Rikagaku Kikai Co., Ltd.), and further passed through a sieve having a mesh size of 250 μm to remove aggregates to obtain a raw material mixed powder. A compounding ratio (first compounding composition (% by mass)) here was designed so that z=0.22 calculated from a Si/Al ratio in a general formula of β-type sialon: $Si_{6-z}Al_zO_zN_{8-z}$, excluding europium oxide.

<First Firing Step>

A cylindrical boron nitride container with a lid (manufactured by Denka, N-1 grade) having an inner diameter of 10 cm and a height of 10 cm is filled with 200 g of the raw material mixed powder having the first compounding composition obtained here, and a heating treatment (first firing step) was performed at 1850° C. for 4 hours in a pressurized nitrogen atmosphere of 0.8 MPa in an electric furnace of a carbon heater. The powder subjected to the heating treatment was passed through a sieve having a mesh size of 45 μm. All the powder passed through the sieve. This powder that has been subjected to the first firing step and has passed through the sieve (referred to as the first fired powder) and the raw material mixed powder having the first compounding composition were compounded in a mass ratio of 70:30 (second compounding composition (% by mass)), and were mixed by the same method as described above.

<Second Firing Step>

A cylindrical boron nitride container with a lid having an inner diameter of 10 cm and a height of 10 cm is filled with 200 g of the obtained mixed powder, and a heating treatment (second firing step) was performed at 2020° C. for 12 hours in a pressurized nitrogen atmosphere of 0.8 MPa in an electric furnace of a carbon heater.

<Cracking-Crushing Step>

Since the sample after the heating treatment was in the form of loosely aggregated lumps, the lumps were roughly crushed with a hammer and then crushed with a supersonic jet crusher (PJM-80SP, manufactured by Nippon Pneumatic Industries Co., Ltd.). The crushing conditions were a sample supply rate of 50 g/min and a crushing air pressure of 0.3 MPa. This crushed powder passed through a sieve having a mesh size of 45 μm. The passing rate of the sieve was 96%.

<Annealing Treatment Step>

A cylindrical boron nitride container with a lid having an inner diameter of 10 cm and a height of 10 cm was filled with 600 g of the crushed powder which was subjected to the second firing step and passed through the sieve having a mesh size of 45 μm while tapping. In this case, the powder was so densely packed to extent that the powder came into contact with the lid. The filled container was subjected to the annealing treatment at 1500° C. for 8 hours in an atmosphere of atmospheric pressure argon in an electric furnace of a carbon heater. When the temperature of the annealing was lowered, the temperature in the temperature range of 1000° C. to 1500° C. was lowered at 5° C./min. The powder subjected to the annealing treatment passed through a sieve having a mesh size of 45 μm. The passing rate of the sieve was 95%.

<Acid Treatment Step>

The acid treatment was performed on the powder subjected to the annealing treatment by immersing in a 1:1 mixed acid of 50% hydrofluoric acid and 70% nitric acid at 75° C. for 30 minutes.

<Washing-Filtering Step>

The powder after the acid treatment is precipitated, and decantation to remove supernatant and a fine powder is repeated until the pH of the solution is equal to or higher than 5 and the supernatant becomes transparent, and a final obtained precipitate is filtered and dried to obtain a phosphor powder of Example 1. As a result of a powder X-ray diffraction measurement, an existing crystal phase was a β-type sialon single phase and it could be confirmed that the β-type sialon phosphor was obtained as a single phase.

Example 2

A phosphor powder of Example 2 was prepared by the same method as in Example 1, except that the second compounding composition (% by mass) of Example 1 was compounded in a compounding ratio of the first fired powder to the raw material mixed powder having the first compounding composition of 50:50 in terms of a mass ratio. When the powder subjected to the annealing treatment passed through a sieve having a mesh size of 45 μm, the passing rate of the sieve was 95%.

Example 3

The second compounding composition (% by mass) of Example 1 was compounded in a compounding ratio of the first fired powder to the raw material mixed powder having the first compounding composition of 30:70 in terms of a mass ratio, the second firing was performed in the same conditions as in Example 1. The crushing conditions after the heating treatment were set to a sample supply rate of 50 g/min and a crushing air pressure of 0.5 MPa. Except for this, a phosphor powder of Example 3 was prepared by the same method as in Example 1. When the powder subjected to the annealing treatment passed through a sieve having a mesh size of 45 μm, the passing rate of the sieve was 96%.

Comparative Example 1

A phosphor powder of Comparative Example 1 was prepared by the same method as in Example 1 except that, in the annealing treatment step, a filling amount was set to 100 g and filling was performed without tapping according to a usual production method of the β-type sialon phosphor. The powder subjected to the annealing treatment passed through a sieve having a mesh size of 45 μm, entire powder passed the sieve.

Comparative Example 2

A phosphor powder of Comparative Example 2 was prepared by the same method as in Example 1 except that, in the annealing treatment step, when the temperature of the annealing was lowered, the temperature range of 1000° C. to 1500° C. was lowered at 0.5° C./min. When the powder subjected to the annealing treatment passed through a sieve having a mesh size of 45 μm, the passing rate of the sieve was 84%.

(Evaluation of Emission Characteristics of Phosphor Powder)

The following emission characteristics were evaluated for the obtained phosphor powders of Examples 1 to 3 and Comparative Examples 1 and 2. Results are shown in Table 1.

Regarding a fluorescence characteristic of the phosphor powder, using a Rhodamine B method and a spectrofluorimeter (F-7000, manufactured by Hitachi High-Technologies) calibrated by a standard light source, a dedicated solid sample holder was filled with the phosphor powder, fluorescence spectrum when irradiated with excitation light dispersed at a wavelength of 455 nm was measured, and a peak intensity and a peak wavelength were determined. Since the peak intensity changes depending on a measuring device or a condition, a unit is an arbitrary unit, and the measurement was performed under the same condition, and the phosphor powders of Examples 1 to 3 and Comparative Examples 1 and 2 were continuously measured. The peak intensity of the phosphor powder of Comparative Example 1 was set to 100% for comparison.

(Evaluation of Particle Size Distribution of Phosphor Powder)

The particle diameter distributions in the following two conditions were evaluated for the phosphor powders of Examples 1 to 3 and Comparative Examples 1 and 2. Results are shown in Table 1.

<Condition 1: Median Diameter with Pretreatment Using Ultrasonic Homogenizer>

The dispersion liquid was obtained by collecting 30 mg of the phosphor powder and 100 ml of a sodium hexametaphosphate aqueous solution adjusted to 0.2% in a 200 ml beaker, and then stirring uniformly at room temperature (25° C.) using a spatula to the extent that precipitation does not occur.

The obtained dispersion liquid was placed in a columnar container (inner diameter of 5.5 cm) with a bottom surface having a radius of 2.75 cm, and a cylindrical tip having a radius of 10 mm (outer diameter of 20 mm) of an ultrasonic homogenizer (US-150E, manufactured by Nippon Seiki Seisakusho Co., Ltd.) was immersed in the dispersion liquid in equal to or more than 1.0 cm and irradiated with ultrasonic waves at a frequency of 19.5 kHz and an output of 150 W for 3 minutes to obtain a solution to be measured.

The solution to be measured was poured into a dispersion medium filled in a circulation system to form a sample to be measured, and then particle diameters of the phosphor powder were measured while circulating the sample to be measured by using a flow cell type laser diffraction scattering type particle size distribution measuring device (MT3300EXII, manufactured by Microtrac Bell), and each median diameter of $D_{10}$, $D_{50}$, and $D_{90}$ was determined.

<Condition 2: Median Diameter without Ultrasonic Homogenizer Pretreatment>

A dispersion liquid was prepared in the same manner as in Condition 1 above, and a solution to be measured was obtained without performing the above-described ultrasonic homogenizer treatment. For the obtained solution to be measured, the particle diameters of the phosphor powder were measured using a flow cell type laser diffraction scattering type particle size distribution measuring device in the same manner as in the above Condition 1, and each median diameter of $D_{10}$, $D_{50}$ and $D_{90}$ was determined.

Evaluation results of the phosphor powders of Examples 1 to 3 and Comparative Examples 1 and 2 are summarized in Table 1 below. In the results, the median diameter ($D_{50}$) with pretreatment using the ultrasonic homogenizer was set to D2, and the median diameter ($D_{50}$) without ultrasonic homogenizer pretreatment, in other words, the median diameter measured without the ultrasonic homogenizer treatment was set to D1, and a $D_{50}$ ratio (D1/D2) was calculated. From the value of D1/D2, it was understood that the phosphor powder of Comparative Example 1 had a lower degree of aggregation than those of Examples 1 to 3, and was almost monodisperse. Further, it was found that since in Comparative Example 2, the aggregation was disintegrated by the ultrasonic homogenizer treatment and most of aggregations were monodispersed, and more phosphor powders were aggregated with one another than in Examples 1 to 3.

parative Examples 3 and 4 were also produced in the same manner as in Example 4 except that the phosphor powders of Example 3 and Comparative Examples 1 and 2 were used, respectively. The addition amount ratios between the β-type sialon phosphor and the fluoride phosphor were adjusted so that the chromaticity coordinates (x, y) of the white LED became (0.28, 0.27) during energized light emission.

(Evaluation of Brightness)

The chromaticity when the white LEDs of Examples 4 to 6 and Comparative Examples 3 and 4 were energized to emit light was measured by a total luminous flux measuring device (manufactured by Otsuka Electronics Co., Ltd., a device that combines a 300 mm diameter integrating hemisphere and a spectrophotometer/MCPD-9800). From the obtained white LEDs, 10 pieces each having a chromaticity x in the range of 0.275 to 0.284 and a chromaticity y in the range of 0.265 to 0.274 were picked up, and an average value of the total luminous flux when the white LEDs were energized to emit light was calculated. An evaluation result was a relative evaluation in a case where the average value of the total luminous flux of Comparative Example 3 was set to 100%. Results thereof are shown in Table 2.

TABLE 2

|  | Total luminous flux |
|---|---|
| Example 4 | 106 |
| Example 5 | 106 |

TABLE 1

| | Particle size distribution (μm) <with pretreatment using homogenizer> | | | Particle size distribution (μm) <without homogenizer pretreatment> | | | | Fluorescence characteristics | |
|---|---|---|---|---|---|---|---|---|---|
| | $D_{10}$ | $D_{50}$ (D2) | $D_{90}$ | $D_{10}$ | $D_{50}$ (D1) | $D_{90}$ | D1/D2 | Peak intensity | Peak wavelength (nm) |
| Example 1 | 12.2 | 22.4 | 41.9 | 19.5 | 32.9 | 53.5 | 1.47 | 100 | 541 |
| Example 2 | 9.6 | 15.8 | 26.9 | 15.9 | 25.4 | 40.5 | 1.61 | 100 | 541 |
| Example 3 | 8.3 | 12.4 | 19.1 | 9.1 | 14.3 | 23.3 | 1.15 | 99 | 540 |
| Comparative Example 1 | 11.8 | 22.1 | 42.1 | 11.9 | 22.2 | 41.9 | 1.00 | 100 | 541 |
| Comparative Example 2 | 12.5 | 23.1 | 44.1 | 21.8 | 44.1 | 82.3 | 1.91 | 101 | 541 |

(Evaluation of Emission Characteristics of LED Using β-Type Sialon Phosphor)

The phosphor powder of Example 1 was added to a silicone resin (JCR6175, manufactured by Toray Dow Corning) together with a fluoride phosphor $K_2SiF_6$ phosphor (KR-3K01, manufactured by Denka Company Limited) as a red phosphor and mixed with a rotating and revolving mixer (Awatori Rentaro: ARV-310 manufactured by Thinky Corporation) to obtain a slurry. A white LED of Example 4 was produced by potting the slurry in a surface mount type package to which a blue LED element having a peak wavelength of 450 nm was bonded and then thermosetting the slurry. An addition amount ratio between the β-type sialon phosphor and the fluoride phosphor was adjusted so that chromaticity coordinates (x, y) of the white LED became (0.28, 0.27) during energized light emission.

A white LED of Example 5 was produced by the same method as in Example 4 except that the phosphor powder of Example 2 was used instead of the phosphor powder of Example 1. Further, white LEDs of Example 6 and Com- TABLE 2-continued

|  | Total luminous flux |
|---|---|
| Example 6 | 105 |
| Comparative Example 3 | 100 |
| Comparative Example 4 | 98 |

From the results of Examples and Comparative Examples shown in Tables 1 and 2, it was confirmed that in the phosphor powder of the present embodiment, when the value of the D1/D2 is in a specific range, that is, is in an appropriate aggregation state, the brightness was high when used as the white LED.

Priority is claimed on Japanese Patent Application No. 2019-081456, filed on Apr. 23, 2019, the entire disclosure of which is incorporated herein.

The invention claimed is:

1. A phosphor powder comprising, as a main component: an EU-activated β-type sialon phosphor particles, wherein when a median diameter ($D_{50}$) measured by a wet measurement using a laser diffraction type particle size distribution measuring device, in the phosphor powder which has not been subjected to an ultrasonic homogenizer treatment, is set as D1 and a median diameter ($D_{50}$) measured by the wet measurement using a laser diffraction type particle size distribution measuring device, in the phosphor powder which has been subjected to an ultrasonic homogenizer treatment under the following condition, is set as D2, D1/D2 is equal to or more than 1.05 and equal to or less than 1.70, (conditions) a dispersion liquid in which 30 mg of the phosphor powder is uniformly dispersed in 100 ml of a 0.2% concentration of a sodium hexametaphosphate aqueous solution is added to a columnar container of which a bottom surface has an inner diameter of 5.5 cm, and then, the dispersion liquid is irradiated with ultrasonic waves for 3 minutes at a frequency of 19.5 kHz, and an output of 150 W, in a state where a cylindrical tip, which has an outer diameter of 20 mm, of an ultrasonic homogenizer is immersed in the dispersion liquid in equal to or more than 1.0 cm.

2. The phosphor powder according to claim 1,
wherein D1 is equal to or more than 10 μm and equal to or less than 35 μm.

3. The phosphor powder according to claim 1,
wherein D2 is equal to or more than 8 μm and equal to or less than 25 μm.

4. A light-emitting device comprising:
a light-emitting element; and
a wavelength conversion unit using the phosphor powder according to claim 1.

* * * * *